United States Patent
Barth et al.

(10) Patent No.: US 7,936,052 B2
(45) Date of Patent: May 3, 2011

(54) ON-CHIP RF SHIELDS WITH BACKSIDE REDISTRIBUTION LINES

(75) Inventors: Hans-Joachim Barth, Munich (DE); Jens Pohl, Bernhardswald (DE); Gottfried Beer, Nittendorf (DE); Heinrich Koerner, Bruckmuehl (DE)

(73) Assignee: Infineon Technologies AG, Neubiberg (DE)

( * ) Notice: Subject to any disclaimer, the term of this patent is extended or adjusted under 35 U.S.C. 154(b) by 38 days.

(21) Appl. No.: 12/242,487

(22) Filed: Sep. 30, 2008

(65) Prior Publication Data

US 2010/0078776 A1    Apr. 1, 2010

(51) Int. Cl.
*H01L 29/72* (2006.01)

(52) U.S. Cl. ........ 257/659; 257/678; 257/691; 257/692; 257/698; 257/773

(58) Field of Classification Search ................ 257/659, 257/678, 691, 692, 698, 773
See application file for complete search history.

(56) References Cited

U.S. PATENT DOCUMENTS

| | | |
|---|---|---|
| 5,202,754 A | 4/1993 | Bertin et al. |
| 5,955,789 A | 9/1999 | Vendramin |
| 6,486,534 B1 | 11/2002 | Sridharan et al. |
| 6,548,391 B1 | 4/2003 | Ramm et al. |
| 6,618,267 B1 | 9/2003 | Dalal et al. |
| 6,686,649 B1 | 2/2004 | Mathews et al. |
| 6,947,295 B2 | 9/2005 | Hsieh |
| 7,033,927 B2 | 4/2006 | Cohen et al. |
| 7,427,803 B2 | 9/2008 | Chao et al. |
| 2004/0195591 A1* | 10/2004 | Gehman et al. ............... 257/202 |
| 2006/0186513 A1* | 8/2006 | Kitaguchi ............ 257/659 |
| 2006/0192265 A1 | 8/2006 | Hsu |
| 2006/0229683 A1 | 10/2006 | Wang et al. |
| 2009/0152676 A1* | 6/2009 | Wang ............... 257/531 |

* cited by examiner

*Primary Examiner* — Edward Wojciechowicz
(74) *Attorney, Agent, or Firm* — Slater & Matsil, L.L.P.

(57) ABSTRACT

Structures of a system on chip and methods of forming a system on chip are disclosed. In one embodiment, a method of fabricating the system on chip includes forming a through substrate opening from a back surface of a substrate, the through substrate opening disposed between a first and a second region, the first region comprising devices for RF circuitry and the second region comprising devices for other circuitry. The method further includes forming patterns for redistribution lines on a photo resist layer, the photo resist layer disposed under the back surface, and filling the through substrate opening and the patterns for redistribution lines with a conductive material.

19 Claims, 17 Drawing Sheets

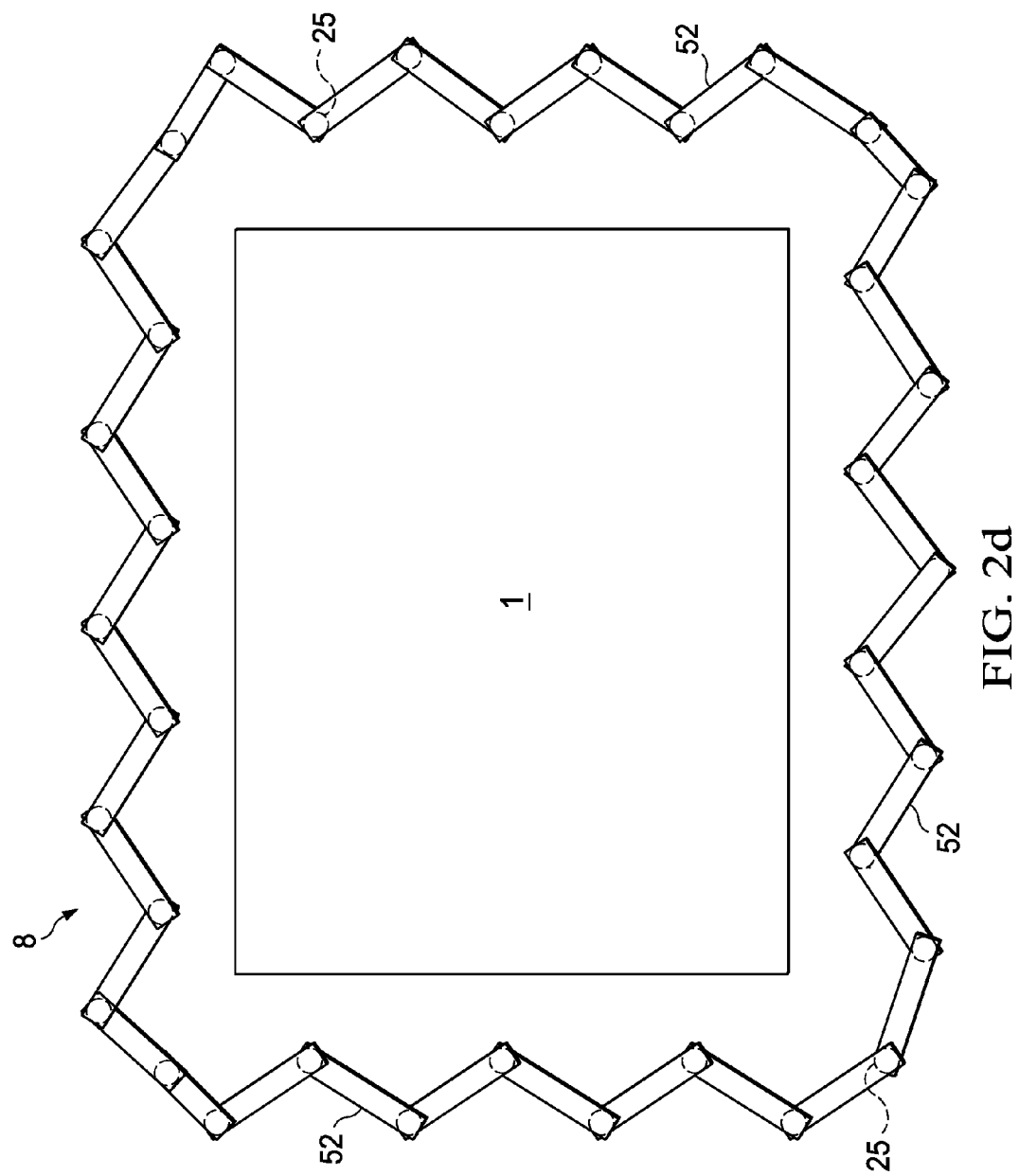

ON-CHIP RF SHIELDS WITH BACKSIDE REDISTRIBUTION LINES

CROSS-REFERENCE TO RELATED APPLICATIONS

This patent application relates to the following commonly assigned co-pending applications each of which is hereby incorporated herein by reference:

| Patent Number | Serial Number | Filing Date | Issue Date |
|---|---|---|---|
| | 12/242,698 | Sep. 30, 2008 | |
| | 12/242,688 | Sep. 30, 2008 | |
| | 12/242,521 | Sep. 30, 2008 | |
| | 12/242,556 | Sep. 30, 2008 | |

TECHNICAL FIELD

This invention relates generally to electronic devices, and more particularly to on-chip RF shields with backside redistribution lines.

BACKGROUND

Semiconductor devices are used in many electronic and other applications. Semiconductor devices comprise integrated circuits that are formed on semiconductor wafers by depositing many types of thin films of material over the semiconductor wafers, and patterning the thin films of material to form the integrated circuits.

There is a demand in semiconductor device technology to integrate many different functions on a single chip, e.g., manufacturing analog and digital circuitry on the same die. In such applications, many different components such as digital, analog or RF circuitry are integrated into a single chip. However, such integration creates additional challenges that need to be overcome. For example, integration of multiple components results in interference between various components. RF circuits operating at high frequencies produce extraneous electromagnetic radiation that interferes with the operation of other components in the integrated system on chip. This problem deteriorates with subsequent technology generations as operating frequencies continuously increase. Aggressive integration of multiple components in a single chip requires the need to eliminate such interference without a significant increase in production costs.

SUMMARY OF THE INVENTION

These and other problems are generally solved or circumvented, and technical advantages are generally achieved, by embodiments of the present invention.

Embodiments of the invention include structures for shielding semiconductor components on a system on chip comprising an RF component from electromagnetic radiation originating from the RF circuitry of the RF component. In accordance with an embodiment of the present invention, a method of fabricating the system on chip comprises forming a through substrate opening from a back surface of a substrate, the through substrate opening disposed between a first and a second region, the first region comprising devices for RF circuitry and the second region comprising devices for other circuitry. The method further comprises forming patterns for redistribution lines on a photo resist layer, and filling the through substrate opening and the patterns for redistribution lines with a conductive material.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 2, which includes FIGS. 2a-2d, illustrates a bottom view of a system on chip and illustrates redistribution lines forming an RF shield around the RF component, in accordance with embodiments of the invention;

FIG. 4, which includes FIGS. 4a and 4b, illustrates a cross-section of a through substrate conductor forming a vertical shield, wherein FIG. 4a illustrates a completely filled through substrate conductor and FIG. 4b illustrates a partially filled through substrate conductor, in accordance with an embodiment of the invention;

FIG. 5, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely, a structure comprising redistribution lines forming an RF shield. In various embodiments, the invention avoids the use of separate shielding layers or structures outside the chip (for example, additional packaging layers). The present invention avoids expensive fabrication costs by integrating the RF shield on-chip rather than being separately attached to the chip. Further, being an integrated RF shield, the manufacturing steps are commonly shared with other components already being used in the fabrication of the system on chip (SoC). Although illustrated with respect to shielding adjacent components on an SoC, the invention may be applied to shielding single chips from adjacent chips.

According to SoC requirements, analog, RF, digital, and memory blocks must all coexist on-chip while interacting minimally (such as generating minimal noise and being highly immune to the received noise). In particular, as operating frequencies increase with scaling, RF components operating at high GHz frequencies emit electromagnetic radiation that interferes with other neighboring components. In various embodiments of the present invention, a conductive shield surrounds the RF components to minimize this interference. The conductive shield blocks out the electromagnetic radiation generated by the RF circuitry from reaching other components of the SoC.

To minimize parasitic elements, conventional redistribution lines such as used for carrying input/output signals and power are designed to be of the shortest length. However, in contrast, in various embodiments, the backside redistribution lines of the RF shield are formed as a large structure to maximize shielding of electromagnetic radiation emitted by the operating RF device.

Figure 1:
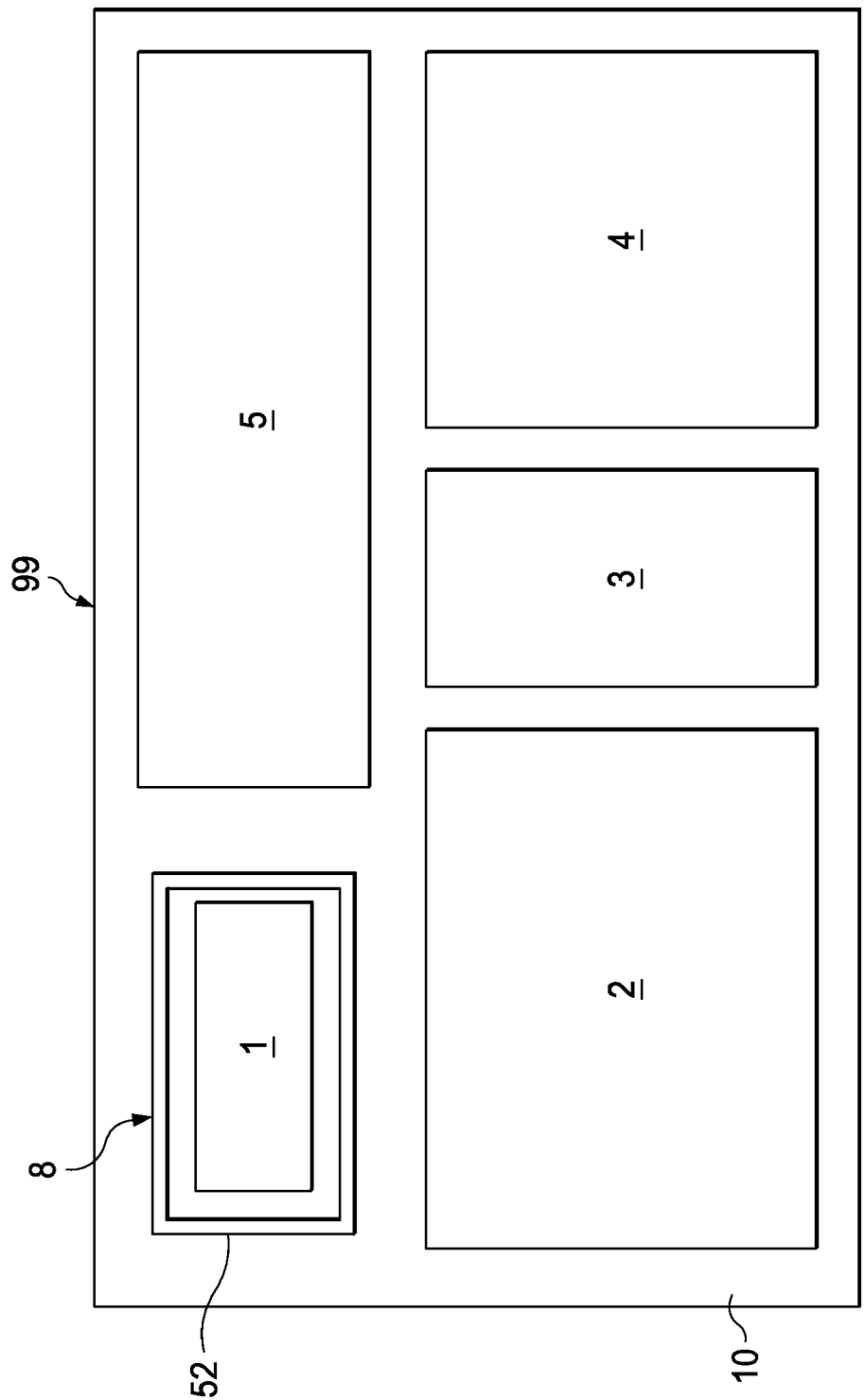
FIG. 1 illustrates a bottom view of a system on chip with a conductive shield comprising redistribution lines formed under the RF component, in accordance with an embodiment of the invention.

A structural embodiment of the invention illustrating a backside view of a conductive cage will be first described using FIG. 1. Embodiments of the invention illustrating bottom cross-sectional views will be described using FIGS. 2 and 3. Vertical cross-sectional views of embodiments of invention will be described using FIG. 4. Embodiments of methods of fabrication of backside redistribution lines coupled to through substrate conductors will be illustrated in FIGS. 5, 7 and 9 and flow charts of FIGS. 6, 8 and 10.

An embodiment of the invention is illustrated in FIG. 1. The SoC chip 99 illustrated in FIG. 1 comprises an RF circuit 1 along with other components. In one embodiment, the SoC chip 99 comprises digital logic component 2, analog component 3, non-volatile memory 4, and SRAM component 5. In various embodiments, less or more components may be present.

In various embodiments, electromagnetic radiation emitted by the RF component 1 is shielded by the RF shield 8. The RF shield 8 comprises a on-chip three dimensional structure enclosing the RF component 1, and is formed as part of the SoC 99. The RF shield 8 comprises a bottom shield 40 disposed on the bottom of the SoC 99, in one embodiment. In various embodiments, the bottom shield 40 is disposed underneath the RF component 1 and/or around the RF component 1. In various embodiments, this arrangement does not require use of additional chip area, and hence involves no additional area penalty. The bottom shield 40 also comprises openings for placing routing to adjacent components.

In various embodiments described in this disclosure, the bottom shield 40 comprises backside redistribution lines 52. The backside redistribution lines 52 may comprise different shapes and arranged to minimize fabrication costs while maximizing the design of the through substrate conductors.

FIG. 2 illustrates an embodiment of the invention and describes a backside of a system on chip illustrating the backside redistribution lines along with through substrate conductors forming a portion of an RF shield. In various embodiments described herein, the redistribution layers comprising backside redistribution lines 52 are formed on the wafer backside for RF shield 8 or EM-shield. The backside redistribution lines 52 are disposed on the backside of the substrate 10 (e.g. backside of wafer or chip) and connected to a node coupled to ground potential.

Figure 2A:
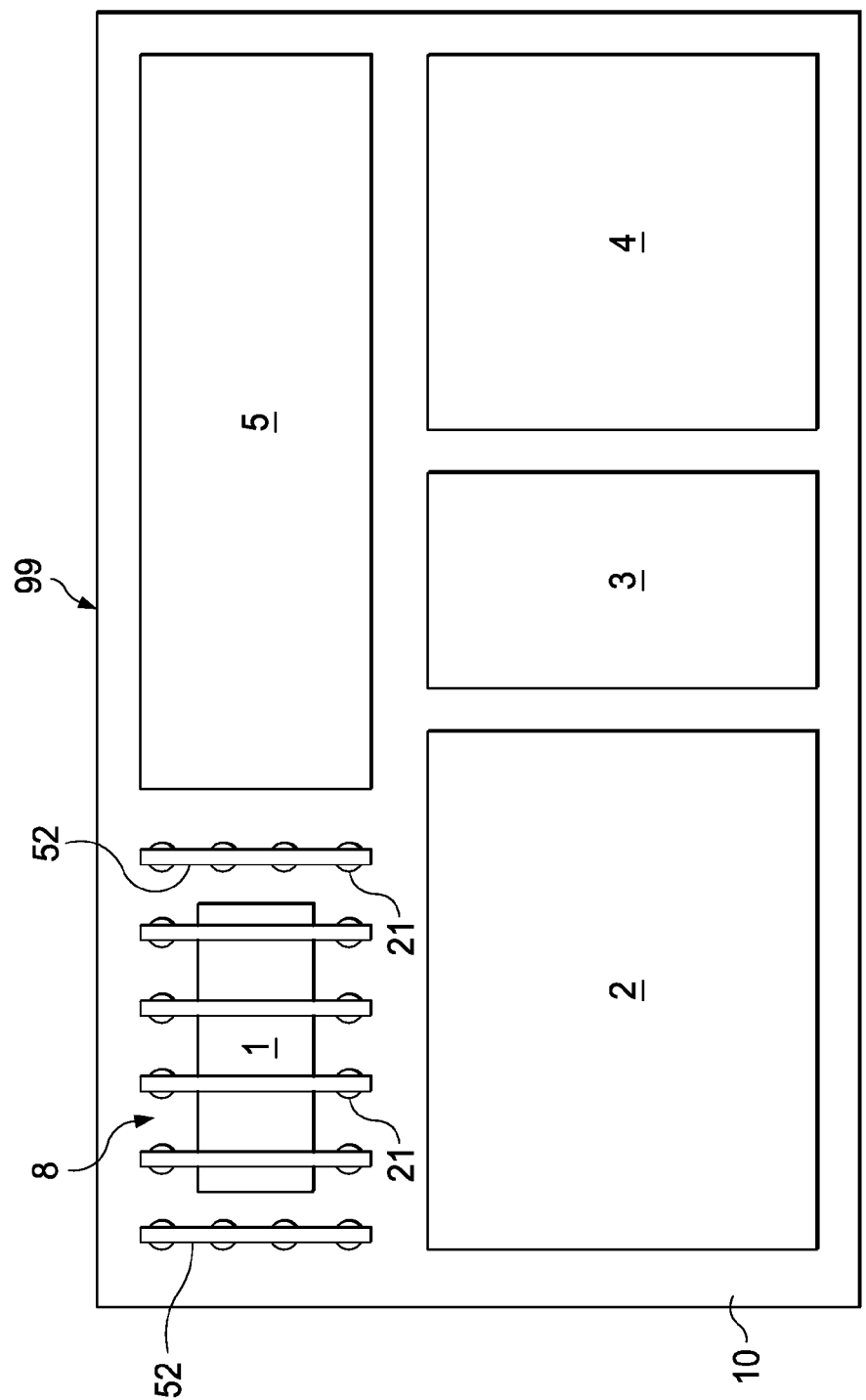
Figure 2B:
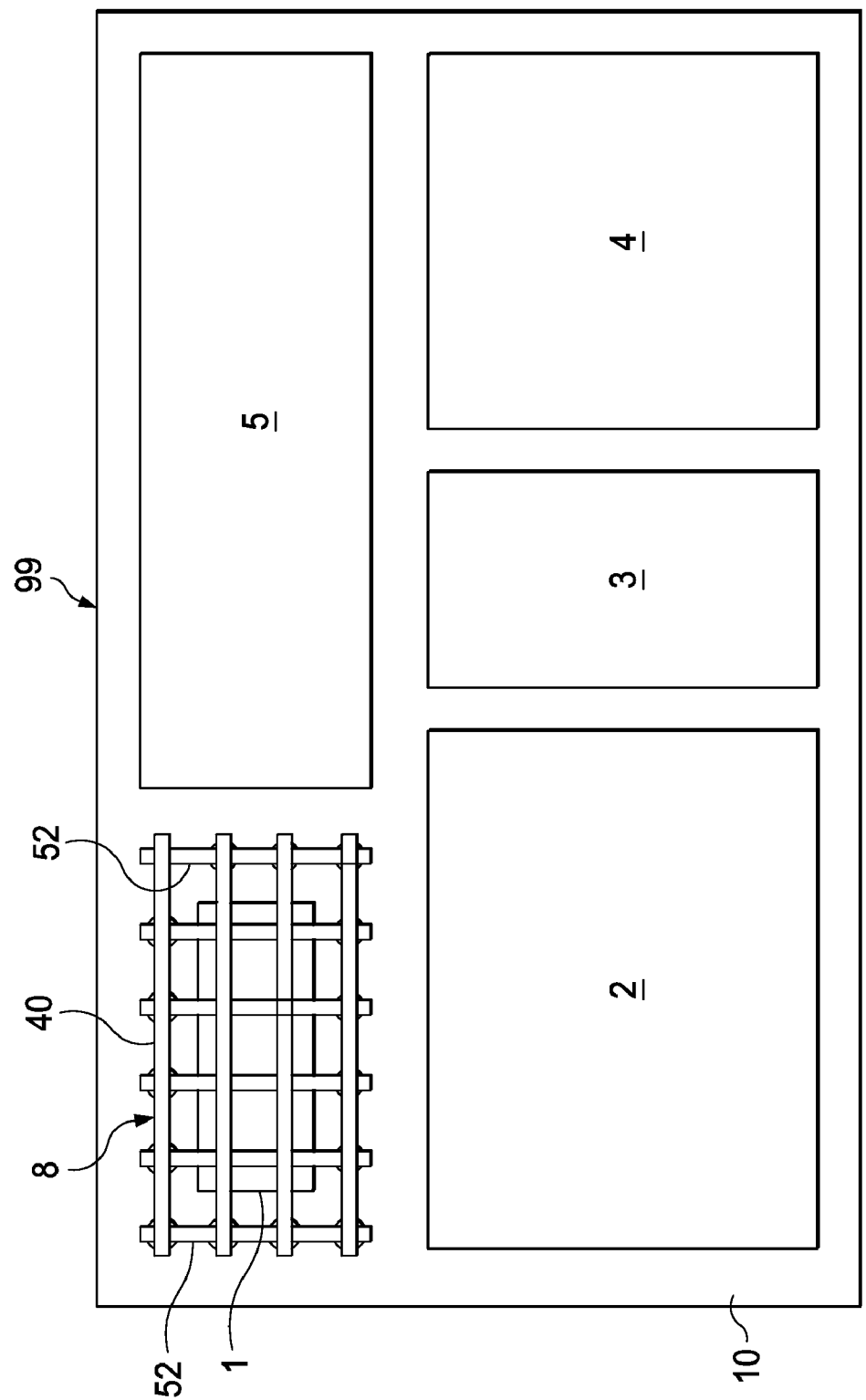

Referring to FIGS. 2a and 2b, a backside view of a system on chip illustrates one embodiment of the backside redistribution lines 52 forming the RF shield 8. While FIG. 2a illustrates the backside redistribution lines 52 aligned parallel to each other, FIG. 2b illustrates further backside redistribution lines 52 aligned perpendicular to the first set of backside redistribution lines 52 illustrated in FIG. 2a. Hence, FIG. 2b illustrates a mesh-like structure formed by the backside redistribution lines 52. The backside redistribution lines 52 are connected to through substrate conductors 25 disposed around the RF component 1. The backside redistribution lines 52 are connected to other parts of the overall RF shield, e.g. to the RF-grids, fences or meshes in the on-chip interconnect layers and to the fences or grids of the through substrate conductors 25.

In various embodiments, the through substrate conductors 25 are formed by etching the wafer from the top surface, or formed later during the fabrication of the backside redistribution lines 52 by etching a through substrate opening from the backside of the substrate 10. All parts of the RF shield are coupled to a ground potential node. The spacing between individual backside redistribution lines 52 is smaller than the wavelength of the RF frequency being shielded. In various embodiments, the backside redistribution lines 52 are designed based on the expected noise of the operating RF component 1. In one embodiment, the spacing between backside redistribution lines 52 is about 100 μm or less is selected to shield RF frequencies up to 1000 GHz, while a spacing of about 10 mm is selected to shield RF frequencies up to 10 GHz. Hence, in various embodiments, the spacing can be optimized for the operating range of the RF circuit. In various embodiments, the backside redistribution lines 52 comprise low resistivity metals.

In various embodiments, the backside redistribution lines 52 comprises a metallic material comprising copper, aluminum, silver, gold, nickel, palladium, tungsten, or a combination thereof. In some embodiments, the backside redistribution lines 52 comprise additional barrier liners. In one embodiment, the backside redistribution lines 52 are lined with a material comprising Ta, TaN, TiW, Ti, TiN, Ru, W, WN, WCN, or a combination thereof. In one embodiment, the backside redistribution lines 52 comprise a silicide material, for example, comprising nickel silicide, cobalt silicide, titanium silicide, platinum silicide, or combinations thereof.

Figure 2C:
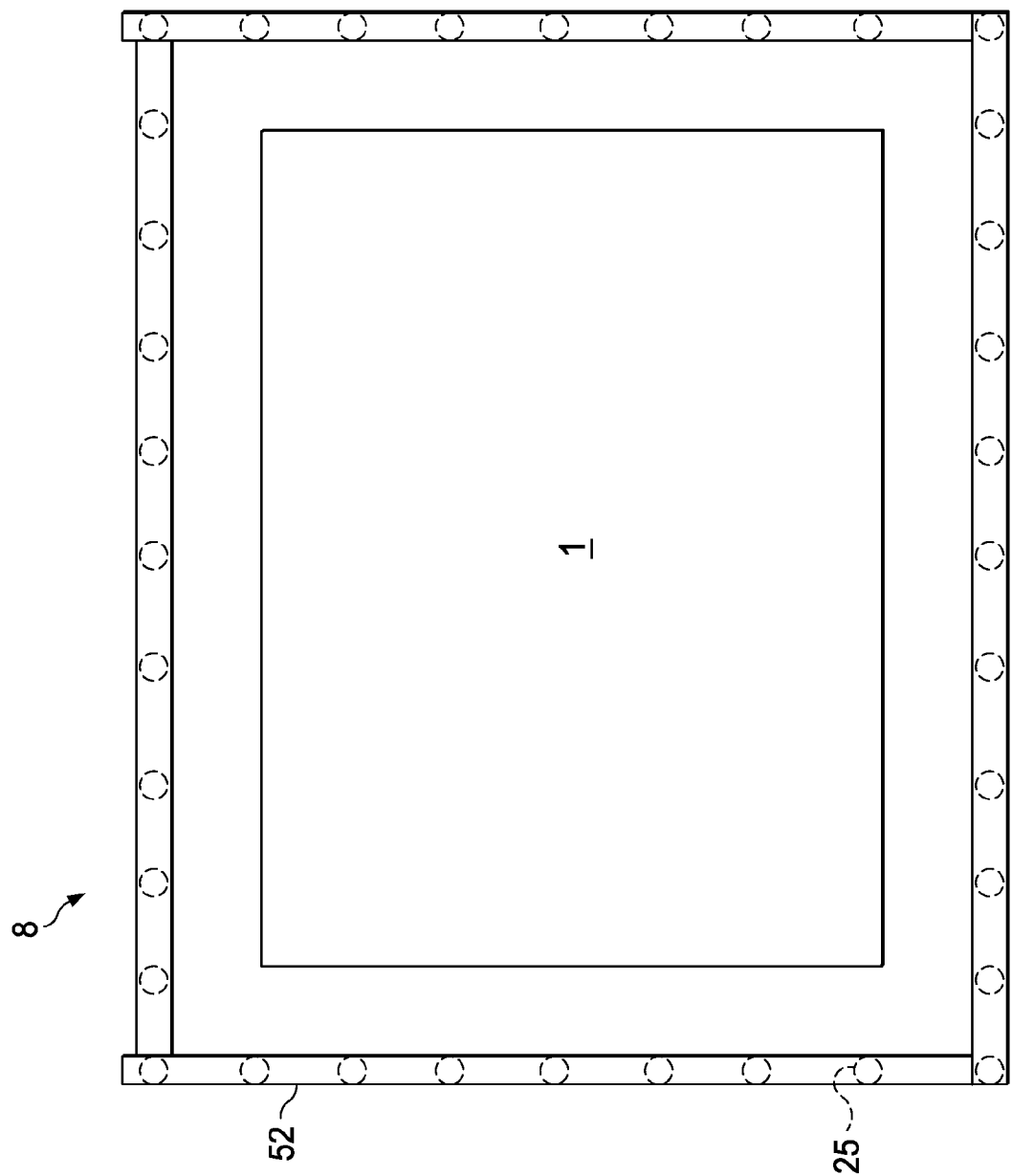

FIGS. 2c and 2d illustrate additional embodiments of the backside redistribution lines 52 wherein the backside redistribution lines 52 are formed along the periphery of the RF component and coupled to the front side circuitry through the through substrate conductors 25.

In some embodiments, the backside redistribution lines 52 may provide connections (not illustrated) coupling the front side circuitry to other components of the chip using the through substrate conductors 25.

Figure 3:
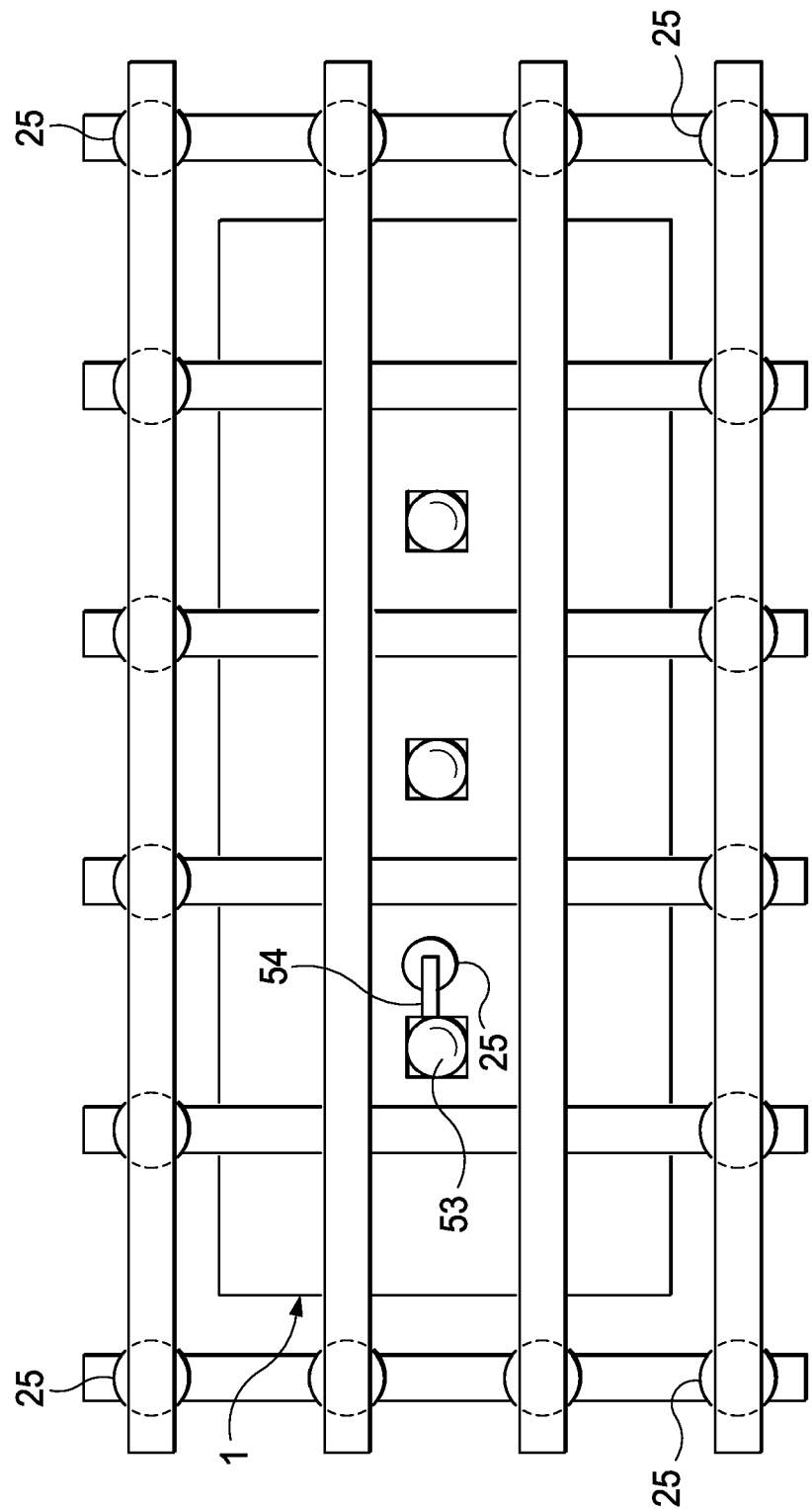
FIG. 3 illustrates a bottom view of a system on chip illustrating redistribution lines forming the RF shield, wherein active through substrate vias and redistribution links are disposed between the redistribution lines.

FIG. 3 illustrates a magnified backside view of the RF component 1. The backside redistribution lines 52 comprise openings as well as larger gaps to allow routing of connections. The backside redistribution layer is used for transmitting signals within a chip or between different chips or I/O or power/ground connections. The backside redistribution layer is disposed under the RF component as well as under the rest of the system on chip, in various embodiments. The connections to the frontside circuitry of the chip is provided by the through via conductors 25, for example, through substrate vias 21. In one embodiment, pads for flip-chip or micro bumps are disposed between the backside redistribution lines 52. In various embodiments, this is possible because moderate RF frequencies, for example, frequencies up to 50 GHz, can include openings between backside redistribution lines 52 of about several mm without degrading shielding. Flip chips or micro bumps that are about 100 μm to about 500 μm in diameter are hence placed between the backside redistribution lines 52 without compromising the capability of the RF shield 8. The (flip chip or micro bump) pads 53 in some embodiments are connected to the through substrate conductors 25 by the backside redistribution links 54 formed along with the backside redistribution lines 52. The backside redistribution links 54 provide electrical coupling of the pads 53 to the frontside of the RF component 1 through the through substrate conductors 25. In various embodiments, the backside redistribution links 54 are formed along with the backside redistribution lines 52 and require no additional processing.

FIG. 4 illustrates vertical cross-sectional views of a through substrate via fabricated in accordance with embodiments of the invention.

Figure 4A:
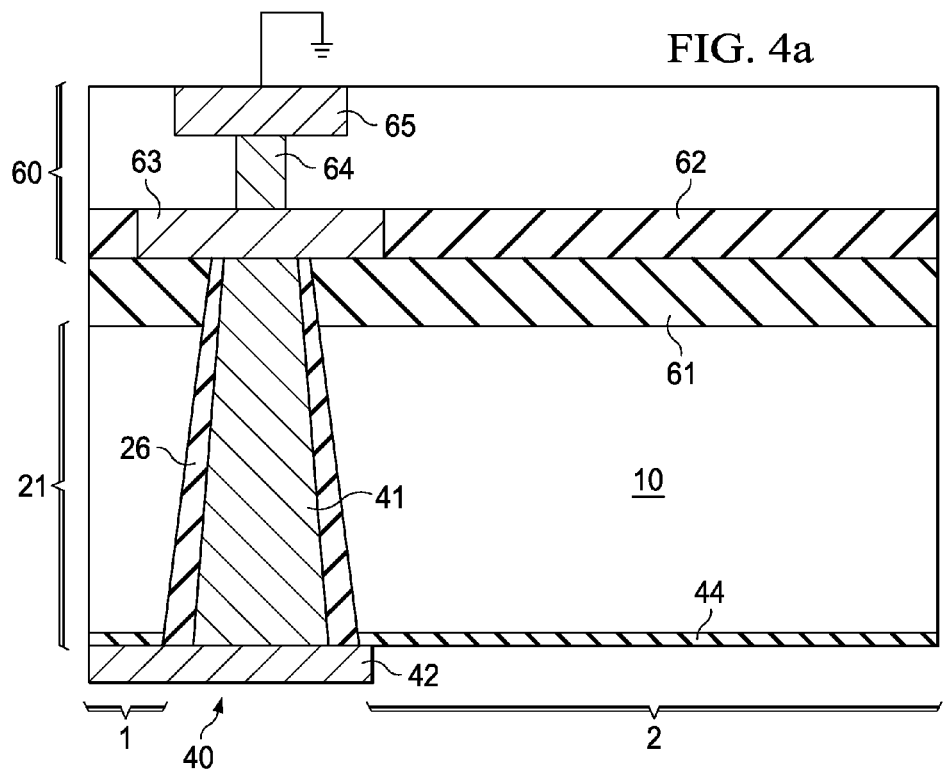

Referring to FIG. 4a, the through substrate via 21 is disposed between an RF component 1 comprising RF circuitry, and another component, for example, a digital logic component 2. The through substrate via 21 forms the vertical fence 20 shielding the digital logic component 2 from the RF component 1. Both the RF component 1 and the digital logic component 2 are disposed in the substrate 10. Examples of the substrate 10 are bulk mono-crystalline silicon substrate (or a layer grown thereon or otherwise formed therein), a layer of (110) silicon on a (100) silicon wafer, a silicon-on-insulator (SOI), or a germanium-on-insulator (GeOI) wafer. In other embodiments, other semiconductors such as silicon germanium, germanium, gallium arsenide, indium arsenide, indium phosphide, indium gallium arsenide, indium antimonide or others can be used with the wafer. The substrate 10 also includes active components such as transistors or diodes, or passive components such as inductors or resistors, among others. Active regions are disposed on a top surface of the substrate and comprise active devices such as transistors, resistors, capacitors, diodes etc. Metallization levels are disposed over the top surface of the substrate 10. Interconnect layers 60 are disposed above the substrate 10 and comprise the metallization levels that interconnect the circuit.

The through substrate via 21 couples to a landing pad 63a on the first metal level of the interconnect layers 60. The landing pad 63a is wider than the width of the through substrate via 21. The landing pad 63a electrically connects to the through substrate via 21. If the through substrate via 21 is part of the RF shield 8, the landing pad 63a is electrically coupled to a ground potential through the interconnect layer 60. In some embodiments, the through substrate via 21 is also electrically connected with other parts of the active circuitry through the landing pad 63a.

The first metal level comprises first metal lines 63 disposed over the substrate 10. The first metal lines 63 are disposed over a first metallization insulation layer 61. The first metallization insulation layer 61 is disposed over the substrate 10 and around the through substrate via 21. A second metallization insulation layer 62 is disposed over the first metallization insulation layer 61. The first metal lines 63 are embedded in the second metallization insulation layer 62. The interconnect layer 60 further comprise a first via 64 disposed on the landing pad 63a, and a second metal line 65 coupled to the first via 64.

A first conductive layer 41 is disposed in the inner region of the through substrate via 21, and electrically couples the landing pad 63a to the backside of the substrate 10. The first conductive layer 41 comprises copper, although in other embodiments other conductive materials such as doped polysilicon, tungsten, aluminum, silver, gold, nickel, palladium, or combination thereof are used.

A sidewall dielectric layer 26 is disposed around the through substrate via 21 and electrically isolates the first conductive layer 41. The sidewall dielectric layer 26 is an oxide such as silicon oxide, or a nitride such as silicon nitride or silicon oxynitride. In some embodiments, the sidewall dielectric layer 26 comprises other low-k or high-k dielectric material. In some embodiments, a trench metal liner is disposed on the sidewalls of the through substrate via 21 over the sidewall dielectric layer 26. The trench metal liner acts as a metal diffusion barrier for the first conductive layer 41. In some embodiments, the trench metal liner also contains a seed layer used during subsequent electroplating processes. In one embodiment, the first conductive layer 41 is lined with a trench metal liner comprising Ta, TaN, TiW, Ti, TiN, Ru, W, WN, WCN, or a combination thereof.

The through substrate via 21 is coupled to a bottom shield 40 at the bottom. The bottom shield 40 comprises a second conductive layer 42 contacting the first conductive layer 41.

Figure 4B:
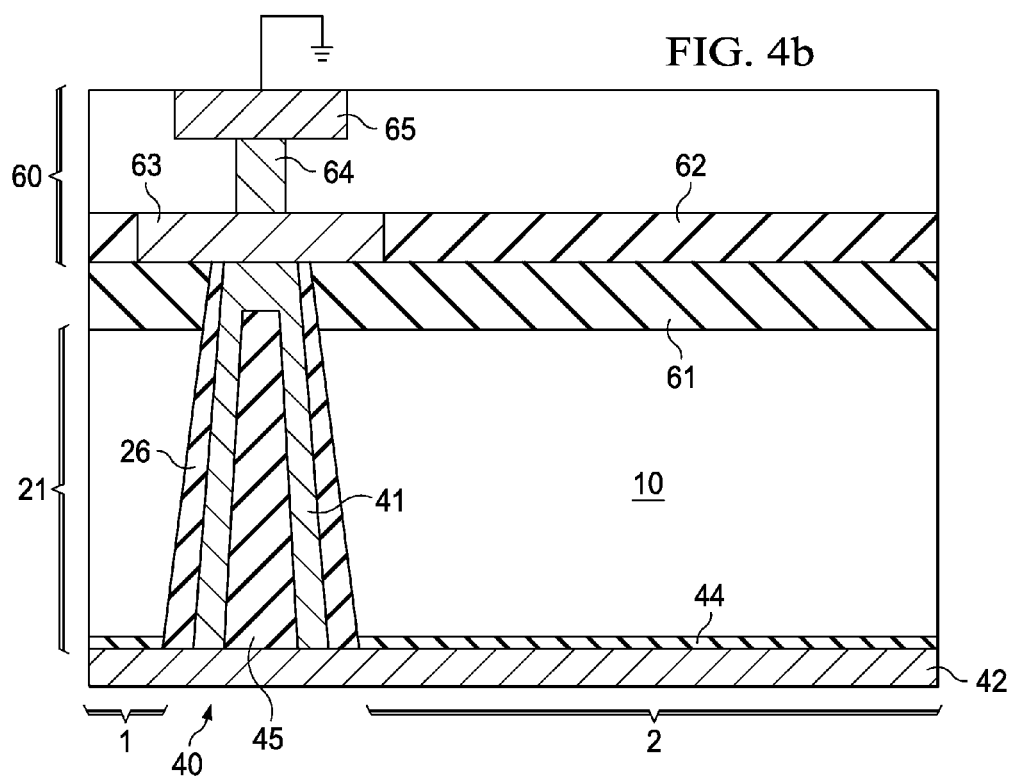

FIG. 4b illustrates an embodiment of the invention, illustrating a partially filled through substrate via 21. Unlike the previous embodiment, FIG. 4b illustrates a first conductive layer 41 partially filling the through substrate via 21. A second conductive layer 42 couples to the first conductive layer 41 and forms the bottom shield 40. A second insulating layer 44 is disposed under the backside of the substrate 10 and isolates the second conductive layer 42. A third insulating layer 45 is disposed on the first conductive layer 41 inside the through substrate via 21.

Embodiments of the invention describing methods of fabrication of the RF shield on the system on chip will be described using FIGS. 5, and 6, and with respect to flow charts of FIGS. 7 and 8. FIG. 5, which includes FIGS. 5a-5j and the flow chart of FIG. 7 describe a method of the embodiment forming a partially filled through substrate via from the backside of the substrate, whereas FIG. 6, which includes FIGS. 6a and 6b describes a fully filled through substrate via from the backside of the substrate. FIG. 8 illustrates an embodiment of a through substrate opening formed from a front side while using a common process to form the conductive part of the through substrate via and backside redistribution lines. The cross-sections are illustrated at a boundary between an RF component 1 and another component (for example, digital logic component 2).

Figure 5A:
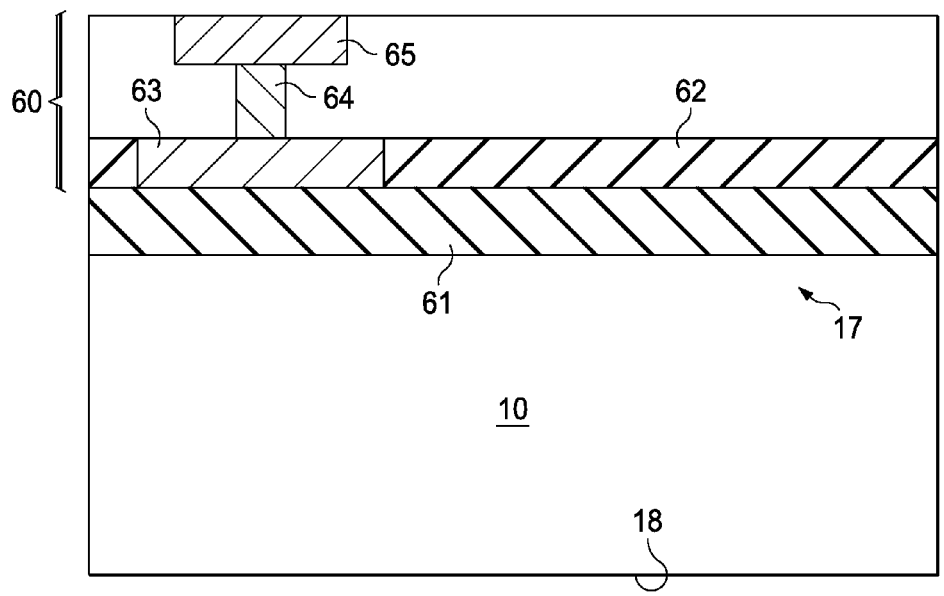
FIGS. 5a-5j, illustrates a cross-section of an RF shield comprising a through substrate conductor in various stages of fabrication, in accordance with an embodiment of the invention.
Figure 7:
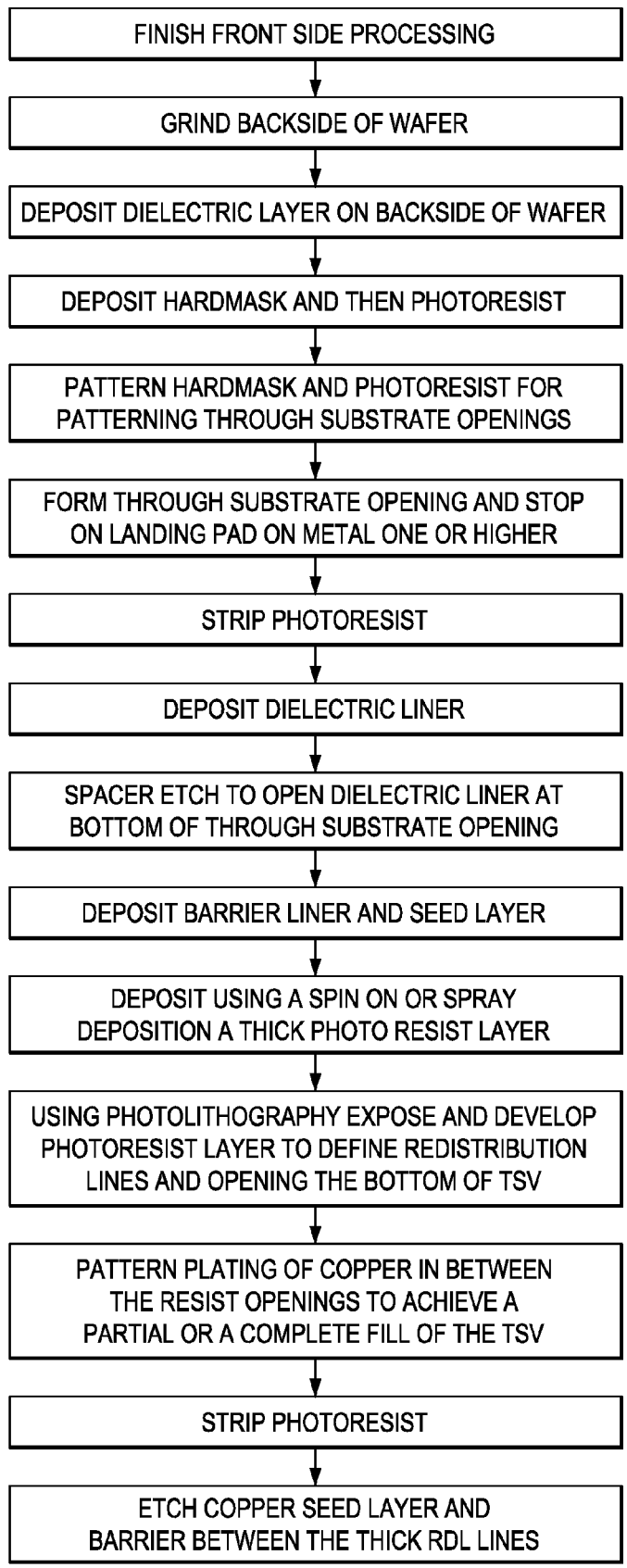
FIG. 7 illustrates a flow chart of the process illustrated in FIGS. 5 and 6, in accordance with an embodiment of the invention.
Figure 8:
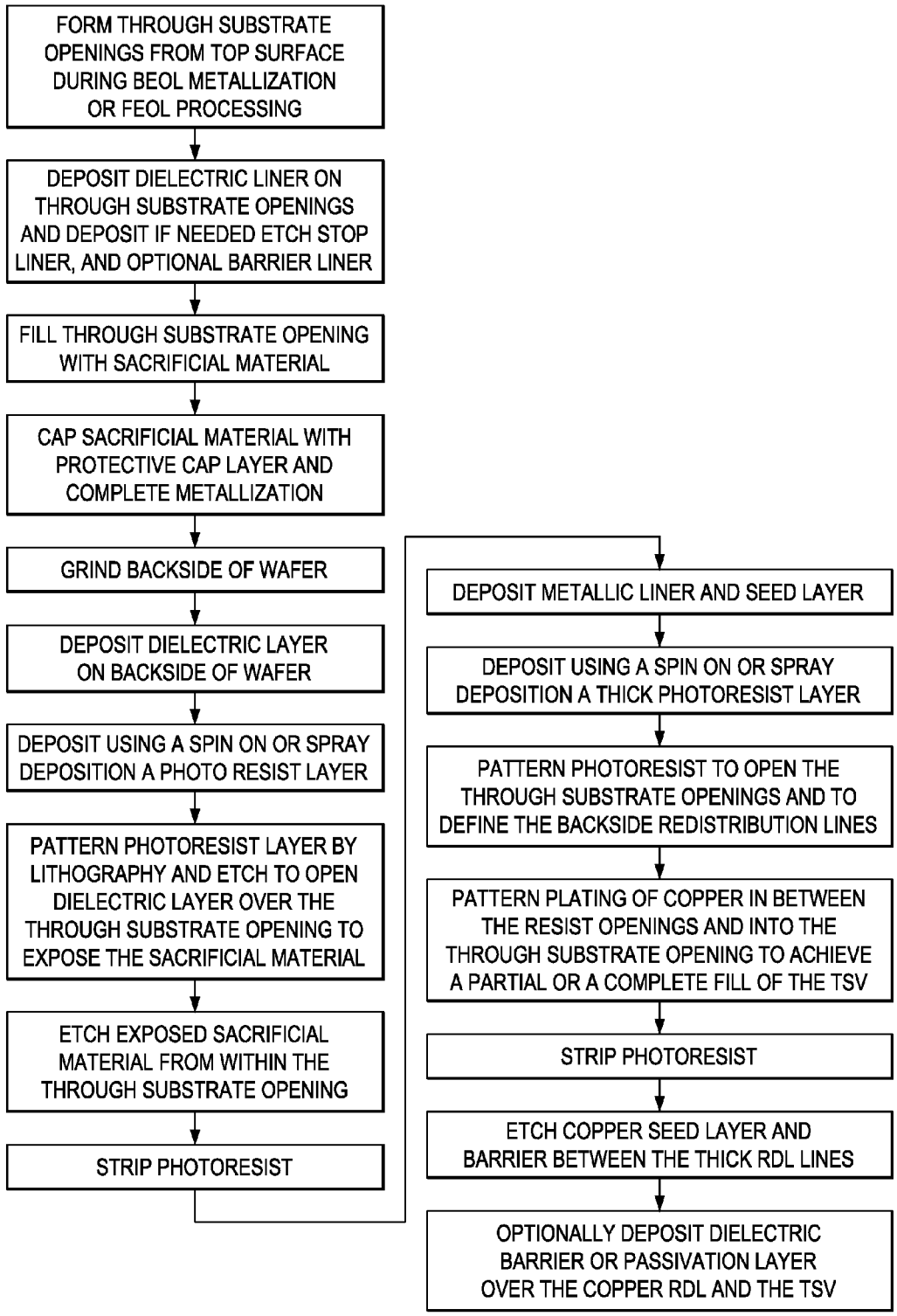
FIG. 8 illustrates a flow chart of the process for forming an RF shield comprising a through substrate conductor in various stages of fabrication, in accordance with an embodiment of the invention.

Referring to FIG. 5a, and as illustrated in flow chart of FIG. 7, active device regions 17 are formed on a side near a top surface of a substrate 10 during front end processing. The substrate 10 is typically a semiconductor wafer. The active device regions 17 or active circuitry includes transistors, diodes, resistors, capacitors, inductors or other components used to form the active devices for the RF component and the other component (digital logic component 2).

Next, metallization is formed in the interconnect layer 60 over the active device regions 17 to electrically contact and interconnect the active device regions 17. The metallization and active circuitry together form a completed functional integrated circuit. In other words, the electrical functions of the chip can be performed by the interconnected active circuitry. In logic devices, the metallization may include many layers, e.g., nine or more, of copper. In memory devices, such as DRAMs, the number of metal levels may be less and may be aluminum.

Returning to the flow chart of FIG. 5, the components formed during the front-end processing are interconnected by back end of line (BEOL) processing. During this process, contacts are made to the semiconductor body and interconnected using metal lines and vias. As discussed above, modern integrated circuits incorporate many layers of vertically stacked metal lines and vias (multilevel metallization) that interconnect the various components in the chip. For simplicity only the first and second metal levels are shown. However, more or less metal levels may be present in various embodiments.

Referring to FIG. 5a and flow chart of FIG. 7, the substrate 10 is thinned exposing a lower surface 18 by grinding to a desired thickness. The typical thickness of the substrate 10 after thinning is about 3 μm to about 300 μm. In different embodiments, the thinning may also be performed chemically or using a plasma etch. For example, a modified plasma etch may be used to thin the silicon wafer from the backside. Such techniques have the additional advantage of not damaging the front side. The advantage of thinning the wafer is to shorten the length of the through-vias, which enhances the electric properties and speeds up the via etch processing and creates a via with relatively vertical sidewall. The thinned substrate 10 may be attached to a suitable carrier for handling.

Figure 5B:
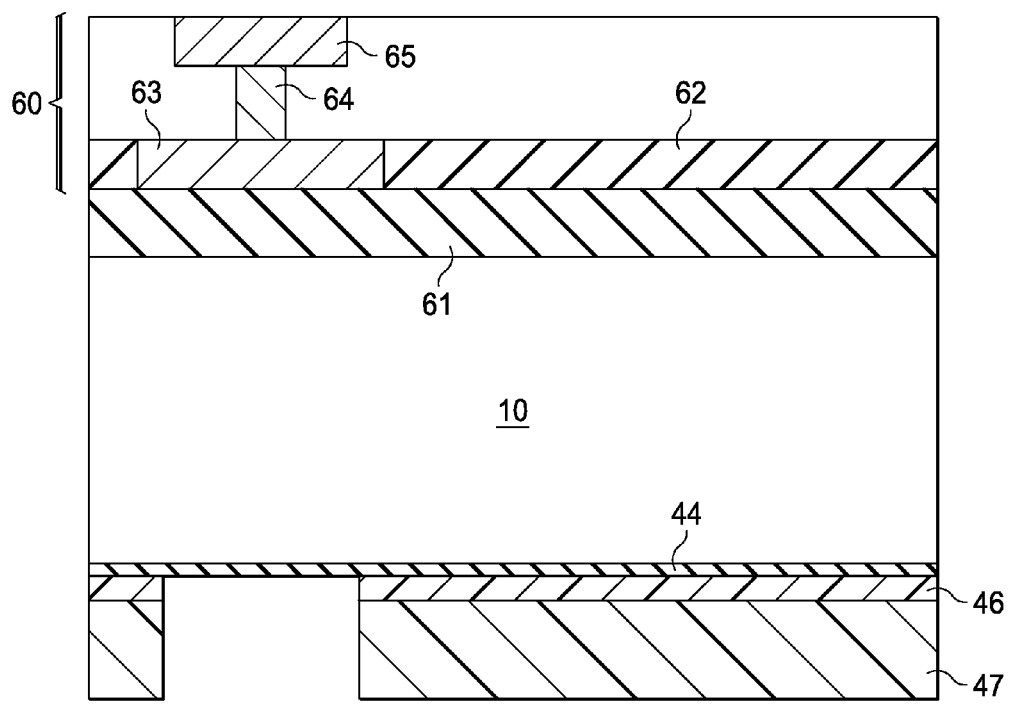

Referring to FIG. 5b, masking layers are deposited over the lower surface 18 of the substrate 10 and patterned. A second insulating layer 44 is deposited over the lower surface 18 of the wafer. A first hard mask layer 46 is deposited on the lower surface 18 of the substrate 10. The first hard mask layer 46 may be a single layer or comprise multiple layers. The first hard mask layer 46 protects the lower surface 18 and the second insulating layer 44 during the through trench etch. The first hard mask layer 46 is selected based on the selectivity to the through trench etch process. For example, in one embodiment, a high density plasma with a fluorine chemistry is used to etch the through substrate opening, and the first hard mask layer 46 comprises a $SiO_2$ hard mask. A first photo resist layer 47 is spun over the first hard mask layer 46.

The landing pads 63a are aligned to a mask using a mask aligner. The mask aligner comprises an infra red mask aligner to detect landing pads 63a, although in other embodiments other suitable techniques may be used. The first photo resist layer 47 is exposed and patterned. The first hard mask layer 46 and underlying second insulating layer 44 are etched to expose the lower surface 16 using the patterned first photo resist layer 47 as a mask.

Figure 5C:
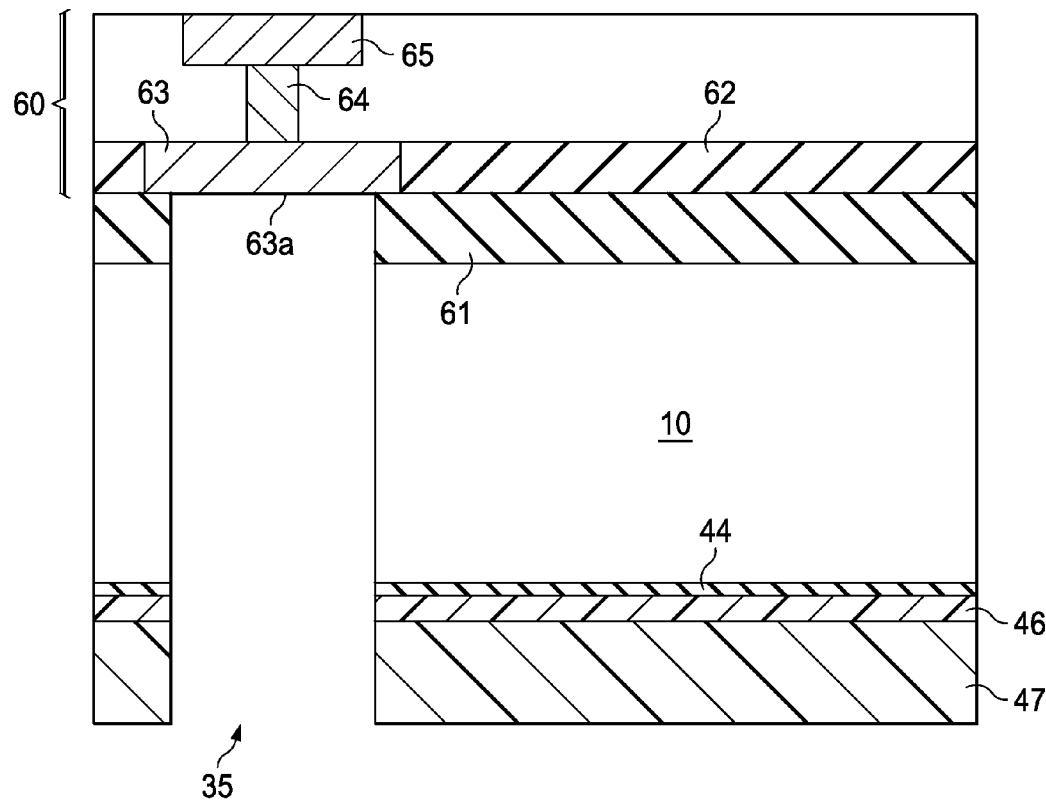

As illustrated in FIG. 5c, a high density plasma process in an RF plasma chamber is used to form a through substrate opening 35. An etch step is carried out using a fluorine based plasma. However, fluorine based etches are isotropic and result in non vertical trench sidewalls. Hence, a deposition step is carried out by introducing a polymer producing gas into the plasma chamber. The polymer producing gas deposits a polymer layer on the exposed sidewalls forming a temporary etch stop layer. The polymer layer is not formed on the exposed bottom surface of the trench due to the high energy of the impinging ions. Any polymer deposited on the bottom surface of the trench is broken up by the high energy of the impinging ions. The through substrate opening process is carried out in sequential etch and deposition steps. A vertical opening may thus be produced. For example, the fluorine etch step may comprise a $SF_6$ etchant, whereas the polymer producing gas may comprise $C_4F_8$. The etch and deposit steps may be repeated many times, e.g., about 100 times to about 500 times, to form the through substrate opening 35. In other embodiments, other types of reaction ion etch processes may be used. After the etch step, the through substrate opening 35 may comprise any suitable vertical shape such as cylindrical, annular, faceted, trench etc.

The etch proceeds by etching the substrate 10 and opens the first metallization insulation layer 61 for etching. Ideally, the through substrate etch process should stop on the landing pad 63a to maximize electrical contact. Further, the interconnect stack over the landing pads 63a should have at least several microns of remaining interconnect material to support the structure mechanically.

The end point of the etch process is typically determined from an analysis (e.g., optically) during etching. For reliable detection, the thickness of the metal lines etched should be higher than about 700 nm. Hence, an etch process may etch beyond the first metal lines 63, but stop in the insulation layer 60. In the absence of the first vias 64 as illustrated in embodiments of the invention, such a through substrate opening 35 is not electrically connected to front end interconnects. The presence of first vias 64 and subsequent levels such as second metal line 65 enables electrical connectivity independent of the etch stop point.

Figure 5D:
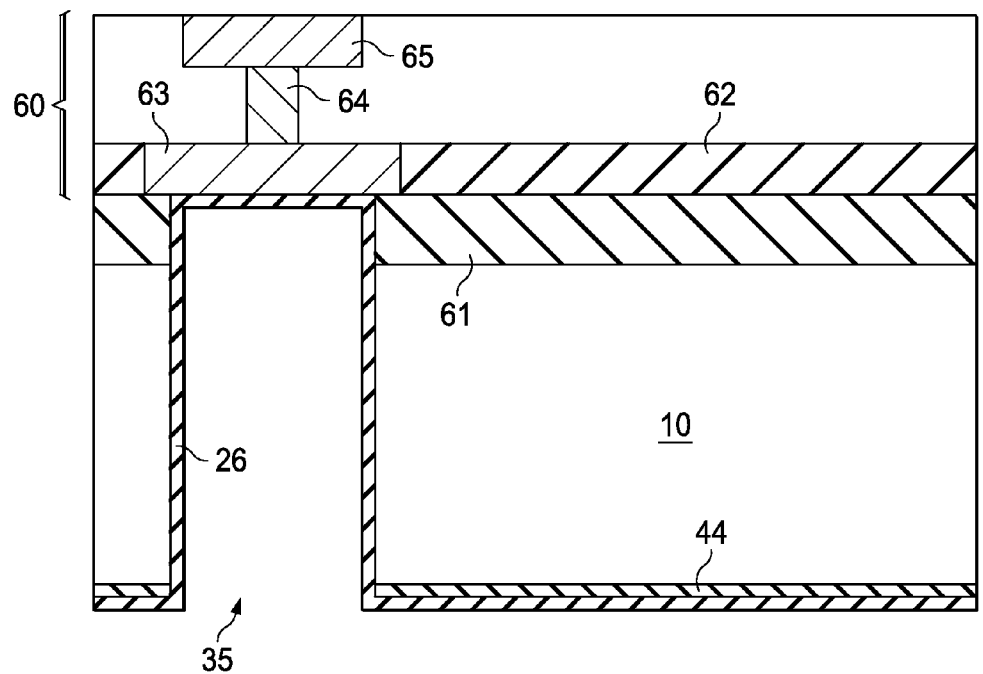
Figure 5E:
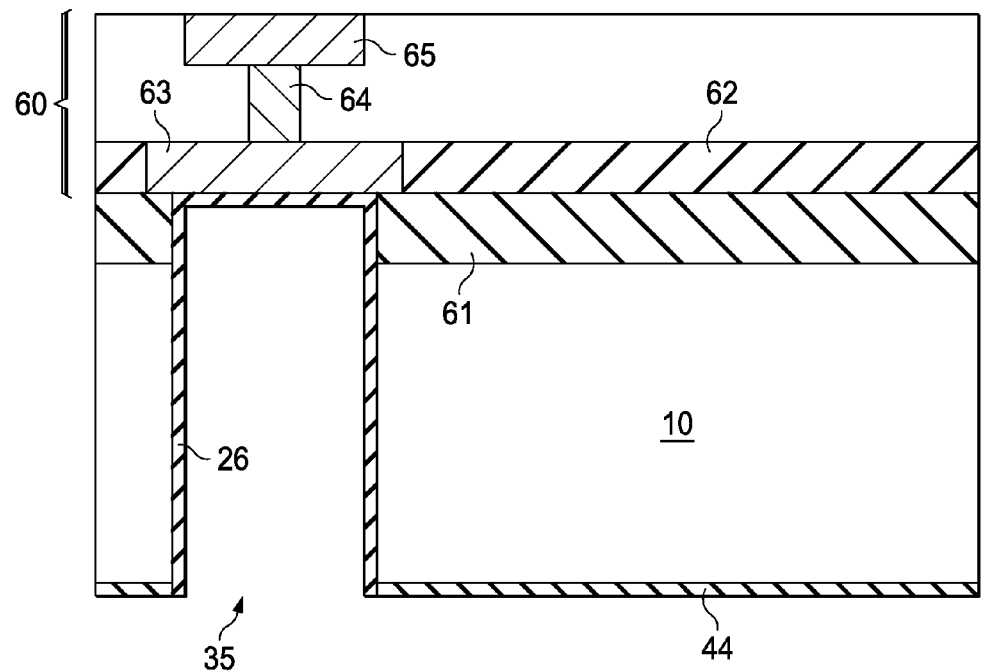

A sidewall dielectric layer 26 is next deposited over the through substrate opening 35. The sidewall dielectric layer 26 electrically isolates the trench fill material from active devices. The sidewall dielectric layer 26 is deposited conformally over the exposed surfaces of the through substrate opening 35 (FIG. 5d). The sidewall dielectric layer 26 may be deposited by a suitable low temperature process such as plasma enhanced CVD and/or organic vapor phase deposition. The sidewall dielectric layer 26 is anisotropically etched forming a sidewall on the through substrate opening 35 (FIG. 5e). On the planar backside surface the dielectric layer 26 and any remaining first hard mask layer 46 is removed, exposing the second insulation layer 44.

Figure 5F:
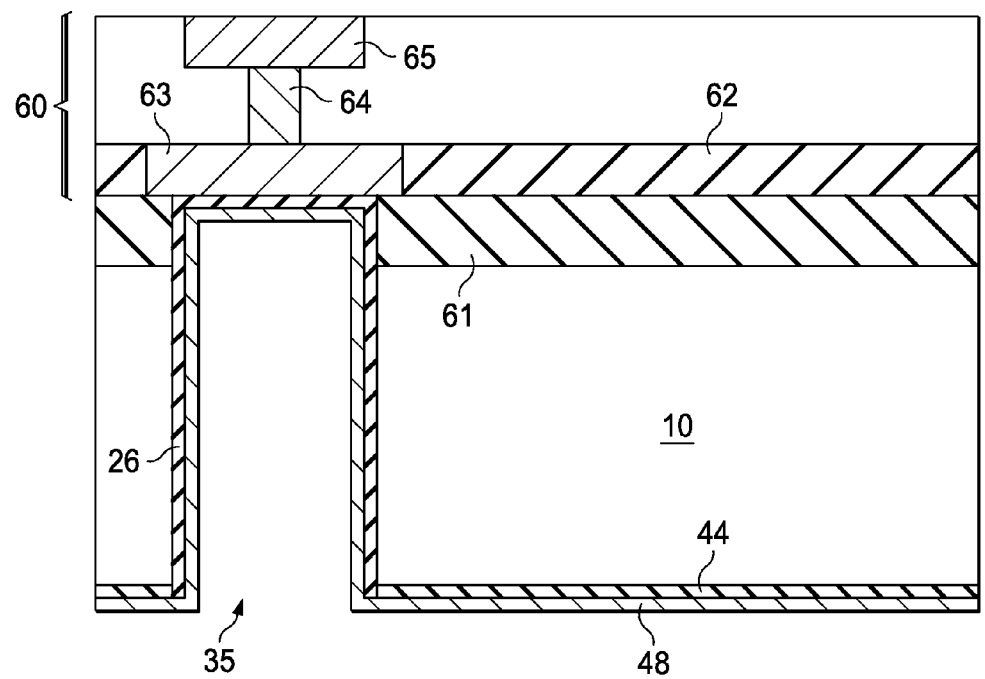

Referring to FIG. 5f, a barrier liner 48 is deposited prior to filling the through substrate opening 35 with the fill material. The barrier liner 48 is conformal, and may comprise a single layer of Ta, TaN, W, WN, WCN, WSi, Ti, TiN and/or Ru as examples. The barrier liner 48 is typically used as a barrier layer for preventing metal from diffusing into the underlying substrate 10 and sidewall dielectric layer 26. The barrier liner 48 is deposited using, for example, RF magnetron sputtering. The barrier liner 48 may comprise a seed layer of copper over the diffusion barrier layer. This seed layer may be deposited conformally, for example, using a PVD sputtering or a metal-organic CVD (MOCVD) process.

Figure 5G:
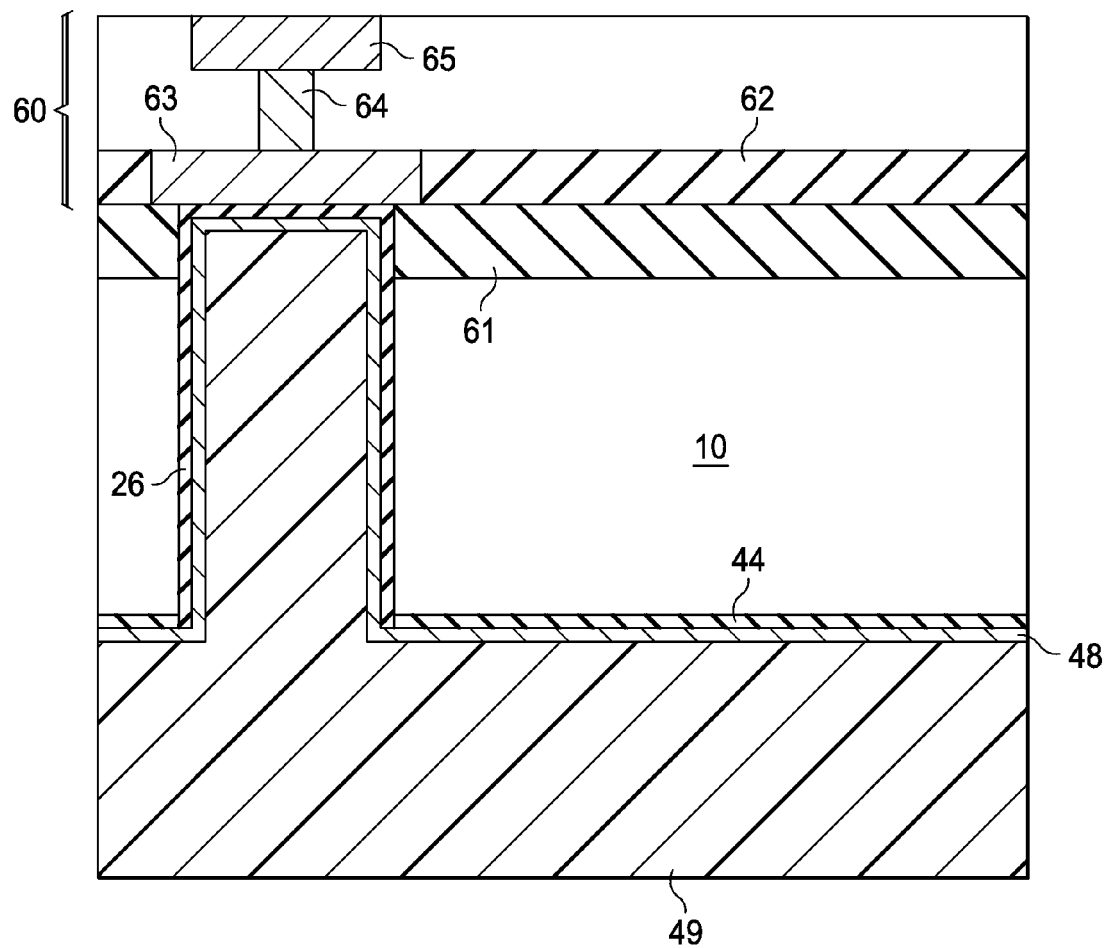
Figure 5H:
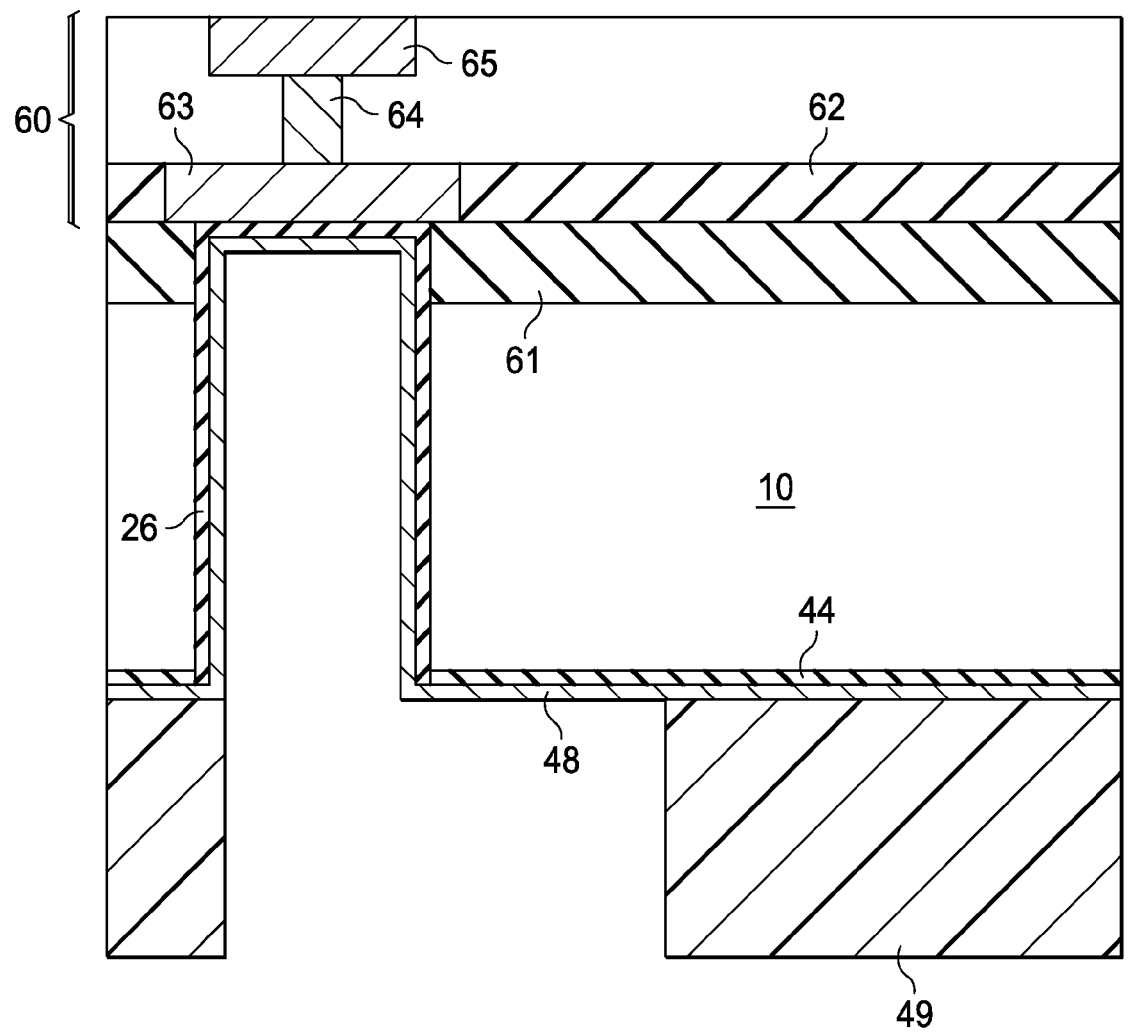

Referring next to FIG. 5g, a second photo resist layer 49 is deposited on the back surface of the substrate 10. In various embodiments, the second photo resist layer 49 is a thick layer of photo resist comprising a thickness of several microns. The second photo resist layer 49 is patterned using a photo lithography step (FIG. 5h). The photo lithography step is performed through a mask with patterns for redistribution lines and through substrate openings 35. The photo lithography step exposes the barrier liner and the optional seed layer of copper over the barrier 48.

Figure 5I:
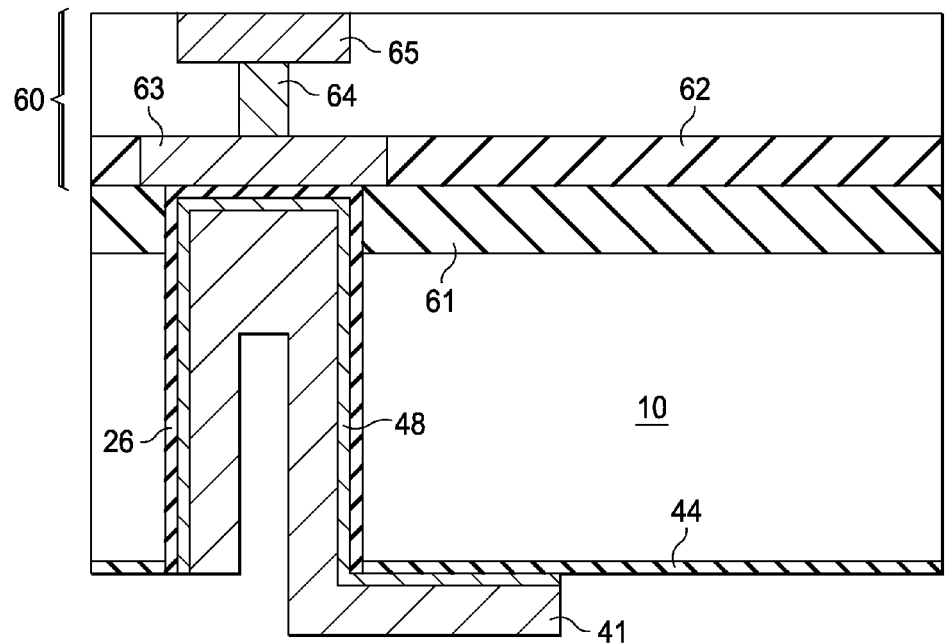

As illustrated in FIG. 5i, a first conductive layer 41 is then deposited on the barrier liner 48 using, for example, an electroplating process. The first conductive layer 41 is thus deposited in between the second photo resist layer 49. The first conductive layer 41 is thus deposited both inside the through substrate opening 41 and on patterns forming for redistribution lines. The first conductive layer 41 partially fills the through substrate opening 35. A partial fill is advantageous as it requires less electroplating time and alleviates stress during subsequent processing.

In one embodiment, the first conductive layer 41 comprises copper. In a different embodiment, the first conductive layer 41 comprises tungsten. If the first conductive layer 41 comprises tungsten, preferably a bi-layer seed layer comprising CVD titanium nitride and silicon doped tungsten are used. Similarly, in some embodiments, doped poly-silicon, silver, gold and/or aluminum may be deposited inside the through substrate opening 35 to form the through substrate conductor 25. Remaining second photo resist layer 49 is stripped to expose the barrier liner 48. The barrier liner 48 is removed by wet or dry etching to expose the underlying second insulating layer 44.

Figure 5J:
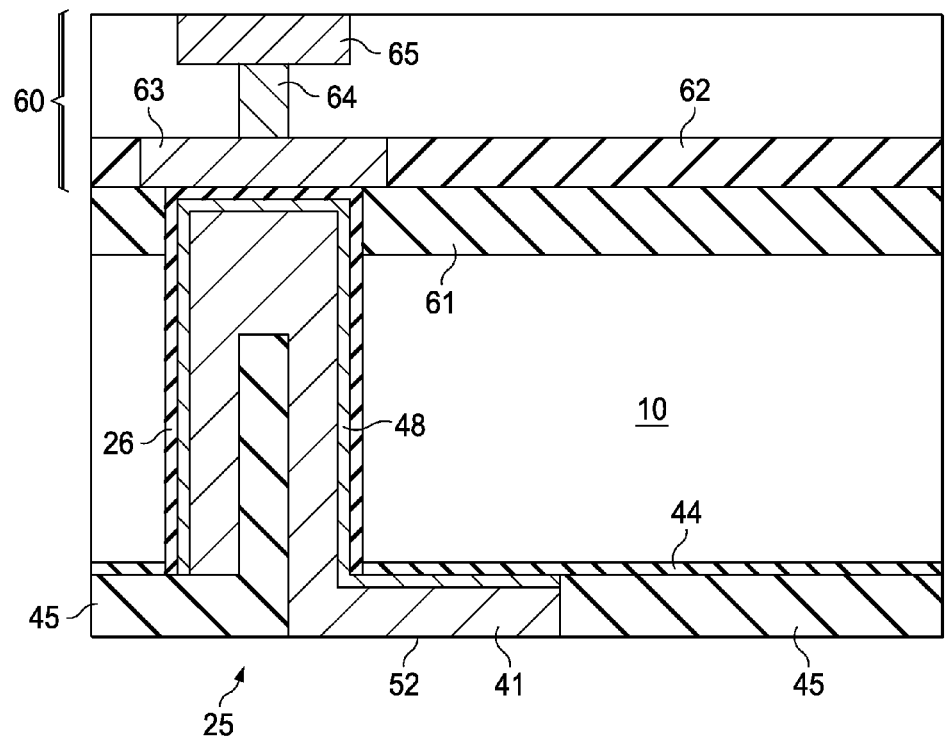

Referring to FIG. 5j, a third insulating layer 45 is deposited over the second insulating layer 44 and the first conductive layer 41. The first conductive layer 41 under the backside of the substrate 10 forms the backside redistribution lines 52, while the first conductive layer 41 inside the through substrate opening 35 forms the conductive element of the through substrate conductor 25. In various embodiments, the substrate 10 is subsequently diced into individual chips after forming the backside redistribution lines 52. Thus the backside redistribution lines 52 and the through substrate conductor 25 are formed simultaneously using a single process avoiding expensive processing.

In a very similar approach a completely filled through substrate opening can be realized. However, in this embodiment, during the pattern plating step of copper in between the resist openings, a thicker copper film is deposited. This thicker copper film completely fills and overfills the through substrate openings. Hence, unlike the prior embodiment, as illustrated in FIG. 6, the first conductive layer 41 completely fills the through substrate opening 35.

As described above in various embodiments, in the same deposition step the conductive material for the metal lines of the backside redistribution layer 52 and the optional flip-chip or micro-bump pads is deposited.

Figure 6:
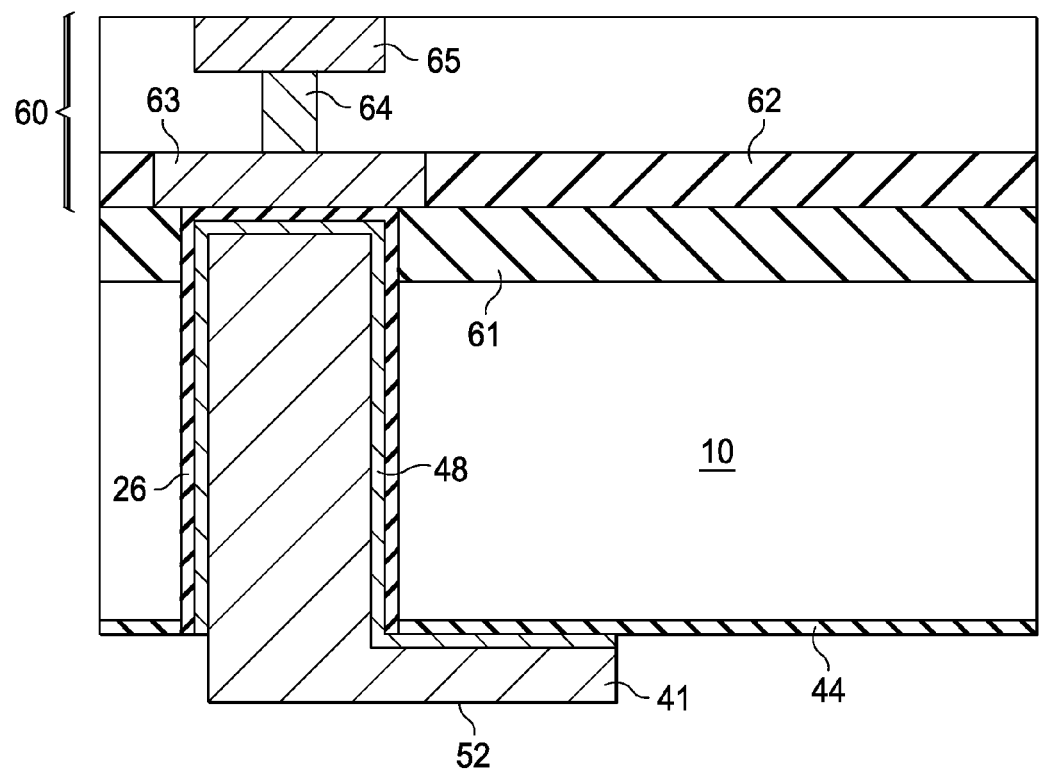
FIG. 6 illustrates a cross-section of an RF shield comprising a through substrate conductor in various stages of fabrication, in accordance with an embodiment of the invention.

FIG. 7 gives a schematic flow chart (as illustrated in FIGS. 5 and 6) of process sequence after the front side processing of the wafer using embodiments of the invention. The metal lines of the backside redistribution layer can be used as part of the RF shield, as signal wires, as wires to provide power and ground or as wires to connect to the flip-chip or micro-bump pads.

FIG. 8 illustrates a schematic process flow for another embodiment of the invention illustrating a through substrate via and redistribution lines formed simultaneously.

Unlike the prior embodiments, in this embodiment the opening for fabricating the through substrate opening is formed from a top surface of the workpiece. This may be preferable in some embodiments, as it avoids resistivity problems arising from mismatched alignment or inability to stop the etch on landing pads.

A first opening is etched from the frontside after forming the active devices. The first opening is formed through the Si substrate and the first metallization insulating layer. A sidewall dielectric liner is deposited over the first opening, the sidewall dielectric liner forming an insulating liner. The sidewall dielectric liner is an oxide or nitride material layer. Up to this step the process sequence is identical to the sequence described in co-pending application Ser. No. 12/242,521, filed on Sep. 30, 2008.

A sacrificial material is spun on or deposited into the first opening. The sacrificial material comprises any material with good etch selectivity with the sidewall dielectric layer and the metal pads which will be built on-top. Examples of sacrificial material include spin on organic materials used as bottom anti-reflective coatings, as well as spin on glass materials or poly-silicon material.

Continuing as described in previously mentioned co-pending application, a second metallization insulating layer is deposited over the first metallization insulating layer. The second metallization insulating layer is patterned for first metal lines. An optional protective cap layer may be deposited over the sacrificial material. In various embodiments, the protective cap layer also forms the barrier liner, for example, a metallic nitride such as TiN or TaN. The protective cap layer comprises an etch selectivity relative to the sacrificial material such that the protective cap layer is not etched while removing the sacrificial material. The first metal lines are formed by electroplating a conductive material. Subsequent levels of metallization, passivation layers and contact pads are subsequently formed. After finishing the frontside processing, the substrate is thinned from the backside to expose a back surface and the sacrificial material in the through silicon opening. A dielectric material is deposited on the backside of the wafer and opened by a lithography and etching sequence to expose again the sacrificial material in the through substrate openings. In the next step the sacrificial material in the through substrate openings is etched out by a wet or dry etch process. This wet or dry etch process needs to be selective to the sidewall dielectric layer of the through substrate openings and the metallic liner and metal of the metal cover of the through substrate opening built in the interconnect levels of the wafer frontside.

As described in prior embodiments (e.g., FIGS. 5f-5j), making use of a metallic liner and seed layer, a patterned thick photoresist layer, backside redistribution lines 52 and through substrate vias 21 are formed simultaneously by filling the through substrate opening and the redistribution layer openings in the photo resist with a conductive material from the back surface. The through substrate opening is filled up with a first conductive layer 41 forming the through substrate vias 21 and backside redistribution lines 52.

Although the sacrificial material is removed in this embodiment, in some embodiments the sacrificial material may be converted into a conductor. For example, if the sacrificial material comprises polysilicon, after thinning the substrate, a silicidation step may be performed from the backside to convert the sacrificial material into a metal silicide.

Figure 9:
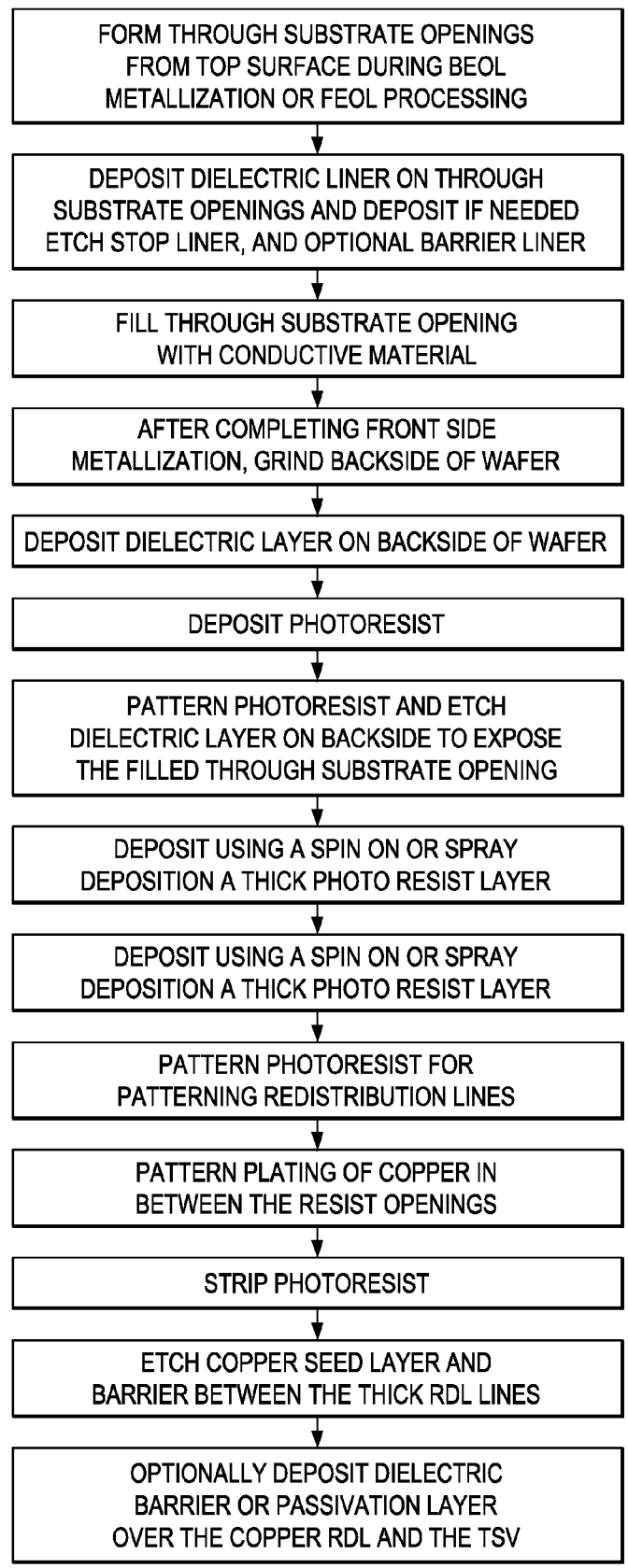
FIG. 9 illustrates a flow chart of the process for fabrication of an RF shield, in accordance with an embodiment of the invention.

In another embodiment of the invention as illustrated in flow chart of FIG. 9, the through substrate via is fabricated during the front side processing of the wafer as described in co-pending application Ser. No. 12/242,521, filed on Sep. 30, 2008. After completing the front side processing, the substrate is thinned from the backside of the wafer until the conductive filling of the through substrate via is exposed. In the next step, a dielectric layer is deposited on the backside of the wafer. The dielectric layer comprises silicon oxide, silicon nitride, silicon carbide, silicon carbonitride, a polymer dielectric, BCB, polyimide, photoimide, or combination thereof. A photoresist is deposited over the dielectric layer and exposed and developed in a photolithography step to define openings in the photoresist over the through substrate vias. In an etching step, the openings are transferred into the dielectric layer exposing the conductive filling of the through substrate openings. A metal liner and a seed layer are deposited to electrically contact the conductive filling of the through silicon via. The metal liner may comprise Ta, TaN, TiW, Ti, TiN, Ru, W, WN, WCN or combinations thereof, and the seed layer may comprise copper, silver, gold, tungsten, aluminum, ruthenium or combinations thereof. After the metal liner and seed layer deposition, another thick photoresist is deposited, exposed and developed in order to define the openings for the conductive redistribution lines on the wafer backside. In a pattern plating step or any other suitable deposition step the conductive material for the redistribution layer is deposited in between the openings of the resist. The conductive material for the redistribution layer on the wafer backside may comprise copper, silver, gold, tungsten, aluminum, ruthenium or combinations thereof. After the deposition of the conductive material for the redistribution layer, the photo resist is stripped followed by an etching step to remove the seed layer and metallic liner previously covered by the photoresist in between the metal lines of the redistribution layer. The conductive redistribution layer deposited in this process sequence is used to build the backside part of the RF shield and is connected to all other parts of the RF-shield by the through silicon vias. All parts of the RF shield are connected to the same ground potential. Other parts of the backside redistribution layer may be used as wires for signal transport, power and ground connections or to build flip-chip or micro-bump pads to connect to other chips, substrates or printed circuit boards.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, there are processes, machines, manufacture, compositions of matter, means, methods, or steps, presently existing or later to be developed, that perform substantially the same function or achieve substantially the same result as the corresponding embodiments described herein that may be utilized according to the present invention. Accordingly, the appended claims are intended to include within their scope such processes, machines, manufacture, compositions of matter, means, methods, or steps.

What is claimed is:

1. A semiconductor integrated circuit chip comprising:
   a first semiconductor component disposed within a first region of a semiconductor substrate;
   a second semiconductor component disposed within a second region of the semiconductor substrate, the second semiconductor component and the first semiconductor component sharing a common boundary and disposed proximate to a top surface of the semiconductor substrate, the first semiconductor component and the second semiconductor component comprising active circuitry; and
   a redistribution layer comprising first and second redistribution lines, the redistribution layer disposed under a bottom surface of the semiconductor substrate, the bottom surface being opposite to the top surface, wherein the first redistribution lines are disposed under the first semiconductor component and isolated from the semiconductor substrate by an insulating layer, wherein the second redistribution lines are disposed under the second semiconductor component, wherein the first redistribution lines are coupled to a ground potential node, and wherein the second redistribution lines are coupled to the active circuitry of the semiconductor component.

2. The semiconductor integrated circuit chip of claim 1, wherein the first semiconductor component comprises an RF component.

3. The semiconductor integrated circuit chip of claim 2, wherein the first and the second redistribution lines comprise a metal selected from the group consisting of copper, gold, silver, aluminum, tungsten, and combinations thereof.

4. The semiconductor integrated circuit chip of claim 2, wherein the first redistribution lines are arranged around the first semiconductor component.

5. The semiconductor integrated circuit chip of claim 2, wherein the first redistribution lines are arranged in multiple rows under the first semiconductor component.

6. The semiconductor integrated circuit chip of claim 5, wherein the first redistribution lines are arranged parallel to each other.

7. The semiconductor integrated circuit chip of claim 6, wherein the redistribution layer further comprises third redistribution lines, the third redistribution lines being disposed under the first semiconductor component, and disposed perpendicular to the first redistribution lines, the third redistribution lines aligned parallel to each other.

8. The semiconductor integrated circuit chip of claim 7, wherein the first redistribution lines and the third redistribution lines form a pattern, the pattern comprising openings, wherein at least some of the openings comprise a pad.

9. The semiconductor integrated circuit chip of claim 2, wherein the first redistribution lines are spaced apart by a distance less than about 300 µm.

10. The semiconductor integrated circuit chip of claim 2, wherein the first redistribution lines are designed to shield the second semiconductor component from electromagnetic radiation emitted by the first semiconductor component.

11. The semiconductor integrated circuit chip of claim 2, wherein the first redistribution lines are coupled to through substrate conductors, the through substrate conductors being disposed in the semiconductor substrate.

12. A semiconductor integrated circuit chip comprising:
    a first semiconductor component disposed within a first region of a semiconductor substrate;
    a second semiconductor component disposed within a second region of the semiconductor substrate, the second semiconductor component and the first semiconductor component sharing a common boundary and disposed proximate a top surface of the semiconductor substrate, the first semiconductor component and the second semiconductor component comprising active circuitry; and
    a back side metallization layer comprising first and second metal lines, the back side metallization layer disposed under a bottom surface of the semiconductor substrate, the bottom surface being opposite to the top surface, wherein a insulating layer is disposed between the first metal lines and the bottom surface of the semiconductor substrate, wherein the second metal lines are disposed under the second semiconductor component, wherein the first metal lines are coupled to a ground potential node, and wherein the second metal lines are coupled to the active circuitry of the semiconductor component.

13. The semiconductor integrated circuit chip of claim 12, wherein the first metal lines are disposed under the first semiconductor component in multiple parallel rows along a first direction.

14. The semiconductor integrated circuit chip of claim 13, wherein the back side metallization layer further comprises third metal lines disposed under the first semiconductor component, the third metal lines intersecting the second metal lines.

15. The semiconductor integrated circuit chip of claim 14, wherein the third metal lines is disposed in multiple parallel rows along a second direction, the second direction being perpendicular to the first direction.

16. The semiconductor integrated circuit chip of claim 12, wherein adjacent first metal lines are separated by a distance smaller than 100 µm.

17. The semiconductor integrated circuit chip of claim 12, wherein adjacent first metal lines are separated by a distance smaller than 10 mm.

18. The semiconductor integrated circuit chip of claim 12, further comprising a through substrate via disposed in the semiconductor substrate.

19. The semiconductor integrated circuit chip of claim 18, wherein the first metal lines are coupled to a ground potential node via the through substrate via.

* * * * *